(12) United States Patent
Kono

(10) Patent No.: US 10,734,375 B2
(45) Date of Patent: Aug. 4, 2020

(54) SEMICONDUCTOR DEVICE

(71) Applicant: DENSO CORPORATION, Kariya, Aichi-pref. (JP)

(72) Inventor: Kenji Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 2 days.

(21) Appl. No.: 16/250,056

(22) Filed: Jan. 17, 2019

(65) Prior Publication Data

US 2019/0148364 A1 May 16, 2019

Related U.S. Application Data

(63) Continuation of application No. PCT/JP2017/023903, filed on Jun. 29, 2017.

(30) Foreign Application Priority Data

Jul. 21, 2016 (JP) .................................. 2016-143300

(51) Int. Cl.
*H01L 27/06* (2006.01)
*H01L 29/40* (2006.01)
(Continued)

(52) U.S. Cl.
CPC ...... *H01L 27/0635* (2013.01); *H01L 27/0629* (2013.01); *H01L 29/0615* (2013.01); *H01L 29/0619* (2013.01); *H01L 29/0834* (2013.01); *H01L 29/407* (2013.01); *H01L 29/7391* (2013.01); *H01L 29/7397* (2013.01); *H01L 29/78* (2013.01); *H01L 24/05* (2013.01); *H01L 24/06* (2013.01); *H01L 29/0696* (2013.01); *H01L 29/1095* (2013.01); *H01L 29/4238* (2013.01); *H01L 2224/04042* (2013.01); *H01L 2224/05554* (2013.01); *H01L 2224/06131* (2013.01); *H01L 2224/06135* (2013.01);
(Continued)

(58) Field of Classification Search
CPC ............. H01L 27/0635; H01L 27/0727; H01L 29/0834; H01L 29/407
See application file for complete search history.

(56) References Cited

U.S. PATENT DOCUMENTS 7,112,868 B2   9/2006   Willmeroth et al.
7,868,397 B2   1/2011   Tsukuda et al.
(Continued)

FOREIGN PATENT DOCUMENTS

JP   2000-243905 A   9/2000
JP   2001-168324 A   6/2001
(Continued)

*Primary Examiner* — Seahvosh Nikmanesh
(74) *Attorney, Agent, or Firm* — Posz Law Group, PLC

(57) ABSTRACT

A semiconductor device includes a plurality of switching devices and a semiconductor substrate. The switching devices are connected in parallel to be driven. The switching devices are at the semiconductor substrate. Each of the switching devices, in a plan view of the semiconductor substrate, includes: a cell region as an IGBT that is provided with an active trench gate to be applied with a gate voltage; a periphery region as a contour of the switching device; and a non-cell region configured to isolate the cell region from the periphery region and arranged with a pad to provide an electrical connection to the cell region. The non-cell region is also provided with an active trench gate that is at a position without overlapping the pad.

6 Claims, 9 Drawing Sheets

(51) Int. Cl.
  *H01L 29/06* (2006.01)
  *H01L 29/08* (2006.01)
  *H01L 29/78* (2006.01)
  *H01L 29/739* (2006.01)
  *H01L 29/10* (2006.01)
  *H01L 29/423* (2006.01)
  *H01L 23/00* (2006.01)
  *H03K 17/12* (2006.01)
  *H03K 17/567* (2006.01)

(52) U.S. Cl.
  CPC .. *H01L 2924/00014* (2013.01); *H03K 17/127* (2013.01); *H03K 17/567* (2013.01)

(56) References Cited

U.S. PATENT DOCUMENTS

| | | |
|---|---|---|
| 9,041,051 B2 | 5/2015 | Chen et al. |
| 2004/0041201 A1 | 3/2004 | Sugiyama et al. |
| 2007/0040184 A1 | 2/2007 | Sugiyama et al. |
| 2007/0040185 A1 | 2/2007 | Sugiyama et al. |
| 2007/0108468 A1 | 5/2007 | Takahashi |
| 2008/0048295 A1 | 2/2008 | Takahashi |
| 2008/0093697 A1 | 4/2008 | Kaneda et al. |
| 2009/0189181 A1 | 7/2009 | Koyama et al. |
| 2009/0242931 A1 | 10/2009 | Tsuzuki et al. |
| 2010/0090248 A1 | 4/2010 | Kouno |
| 2011/0001553 A1 | 1/2011 | Soeno et al. |
| 2011/0220962 A1 | 9/2011 | Koyama et al. |
| 2012/0132954 A1 | 5/2012 | Kouno et al. |
| 2013/0248994 A1 | 9/2013 | Ninomiya |
| 2014/0197451 A1 | 7/2014 | Chen et al. |
| 2015/0243772 A1 | 8/2015 | Chen et al. |

FOREIGN PATENT DOCUMENTS

| | | |
|---|---|---|
| JP | 2010-109545 A | 5/2010 |
| JP | 2010-135677 A | 6/2010 |
| JP | 2011-192822 A | 9/2011 |
| JP | 5186868 B2 | 4/2013 |

SEMICONDUCTOR DEVICE

CROSS REFERENCE TO RELATED APPLICATIONS

The present application is a continuation application of International Patent Application No. PCT/JP2017/023903 filed on Jun. 29, 2017, which designated the U.S. and claims the benefit of priority from Japanese Patent Application No. 2016-143300 filed on Jul. 21, 2016. The entire disclosures of all of the above applications are incorporated herein by reference.

TECHNICAL FIELD

The present disclosure relates to a semiconductor device.

BACKGROUND

A semiconductor device is configured to connect a plurality of switching devices in parallel and to turn on or off at a proper moment for reducing a switching loss and controlling output current.

Parasitic inductance may be generated between the switching devices in the semiconductor device in which the switching devices are connected in parallel. For this reason, an induced electromotive force may be generated during the switching to generate voltage oscillation and current oscultation caused by the voltage oscillation.

When the switching device is an insulated gate bipolar transistor (IGBT) device, capacitance may be added between the gate and the emitter of the IGBT device to suppress voltage oscillation. For example, parasitic capacitance between the gate electrode and the emitter electrode of a trench-gate type IGBT device may be utilized. In addition, a chip capacitor may be added on a mounting board.

SUMMARY

The present disclosure provides a semiconductor device including a plurality of switching devices connected in parallel and a semiconductor substrate.

BRIEF DESCRIPTION OF DRAWINGS

The above object, the other objects, features, and advantages of the present disclosure will become more apparent from the following detailed description with reference to the accompanying drawings, in which.

DETAILED DESCRIPTION

Figure 1:
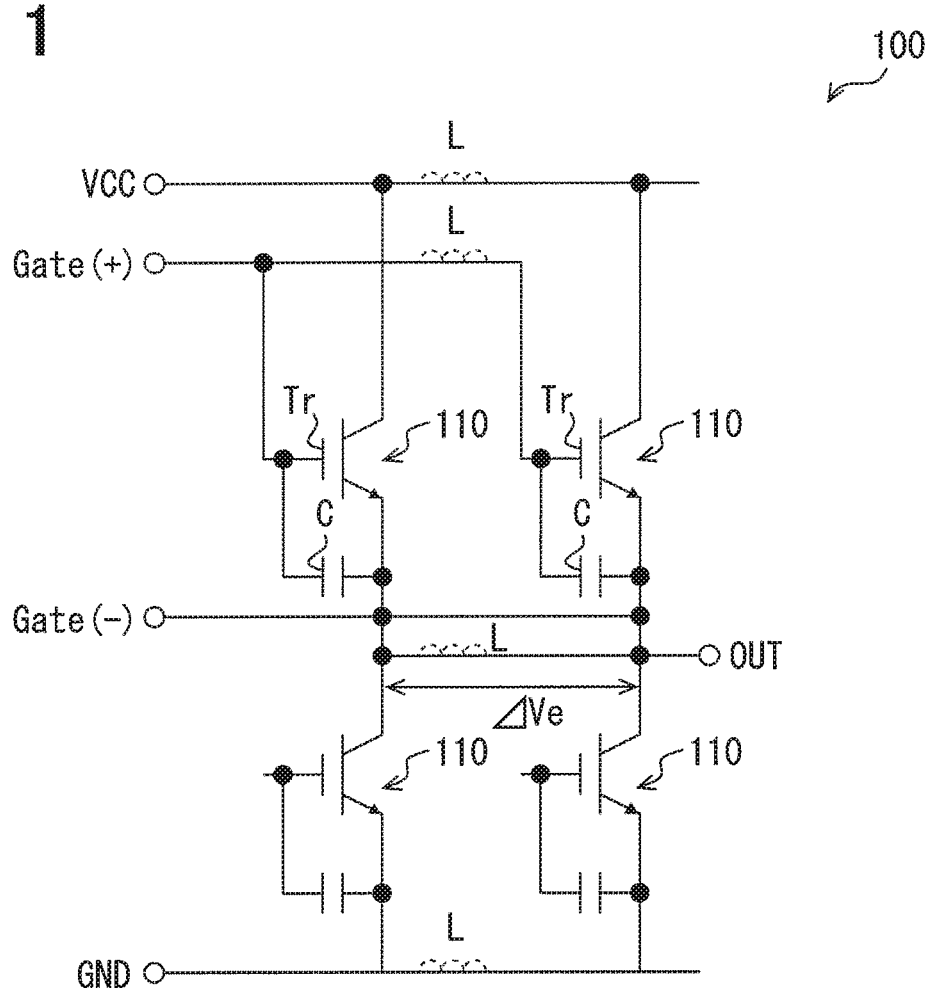
FIG. 1 is a circuit diagram showing the configuration of a semiconductor device according to a first embodiment.

With regard to a semiconductor, a parasitic capacitance is obtained by adding a trench gate under a pad used as an electrode as a part of the periphery region of the chip which does not function as the IGBT device. The pad receives a comparatively large stress at the time of wire bonding. The formation of a structure in which a capacitance is added under the pad may not be functional and may not be reliable in electrical connection. In addition, in a situation of adding a chip capacitor separately on the mounting board, a parasitic inductance may be generated at the wiring used for connecting the chip capacitor. Thus, the effect of suppressing voltage oscillation caused by the capacitance inductance may not be fully attained.

According to an aspect of the present disclosure, a semiconductor device includes a plurality of switching devices and a semiconductor substrate. The switching devices are connected in parallel to be driven. The switching devices are at the semiconductor substrate. Each of the switching devices, in a plan view of the semiconductor substrate, includes: a cell region as an IGBT that is provided with an active trench gate to be applied with a gate voltage; a periphery region as a contour of the switching device; and a non-cell region configured to isolate the cell region from the periphery region and to be arranged with a pad to provide an electrical connection to the cell region. The non-cell region is also provided with an active trench gate that is at a position without overlapping the pad.

Accordingly, the capacitance as the parasitic capacitance may be added between the gate and emitter even at the non-cell region, which is different from the cell region. Since the capacitance is not added through the external connection to the chip capacitor, the capacitance can be increased between the gate and emitter without being influenced by the parasitic inductance.

Since the active trench gate formed with the parasitic capacitance is arranged not to be at the arrangement position of the pad, the reliability of the pad is not degraded.

According to the semiconductor device, the capacitance between the gate and emitter can be increased while maintaining the reliability. In other words, the voltage oscillation caused by the parallel connection of the IGBT devices can be suppressed.

Embodiments of the present disclosure will be hereinafter described with reference to the drawings. Parts identical or equivalent to each other among various drawings are given the same reference numerals.

First Embodiment

First, a schematic configuration of a semiconductor device 100 in accordance with the present embodiment will be described with reference to FIG. 1.

For example, the semiconductor device 100 according to the preset embodiment is provided to a switching circuit in which reverse-conducting insulated gate bipolar transistors (RC-IGBT) are connected in parallel to obtain an output current.

FIG. 1 is a circuit diagram showing the configuration of a semiconductor device 100 according to the present embodiment. With regard to the semiconductor device 100, the switching devices 110 are connected in series between the power supply VCC and the ground level as a reference potential level. Also, the switching devices 110 are provided in two groups, and the two groups are connected in parallel. In other words, the plurality of switching devices 110 are connected in parallel with reference to the power supply VCC. The switching device 110 includes an IGBT device Tr. According to the present embodiment, two IGBT devices Tr are connected in parallel between the power supply VCC and the output OUT. The collector terminal of the IGBT device Tr at the upper section is connected to the power supply VCC, and the emitter terminal is connected to the output OUT. The gate terminal of each IGBT device Tr is configured to receive a gate voltage. The collector terminal of the IGBT device at the lower section is connected to the output OUT, and the emitter terminal is connected to the ground. The IGBT devices Tr at the lower section are connected in parallel with respect to the output OUT.

As described hereinafter, the switching device 110 in the semiconductor device 100 according to the present embodiment is an RC-IGBT, and includes a freewheeling diode (or a flyback diode) Di. However, the illustration of the freewheeling diode is omitted in the circuit illustrated in FIG. 1.

The switching device 110 includes a parasitic capacitance C between the gate terminal and the emitter terminal of the IGBT device Tr. The following describes the reason why the parasitic capacitance C is generated in the structure.

The parasitic inductance L is generated between the switching devices 110, which are connected in parallel. FIG. 1 illustrates that, as an example, a parasitic inductance L is generated in the connection wiring between the power supply VCC and the switching device 110, the gate wiring, and the emitter wiring of the IGBT device Tr. However, the parasitic inductance L may also be generated at, for example, Kelvin emitter wiring or other wiring.

The following describes the IGBT device Tr and the parasitic capacitance C in detail with reference to FIGS. 2 to 5. The plurality of switching devices 110 are equivalent to each other. In other words, the IGBT devices Tr are equivalent to each other, the freewheeling diodes Di are equivalent to each other, and the parasitic capacitances C are equivalent to each other. Therefore, only one switching device 10 is described in the following.

Figure 2:
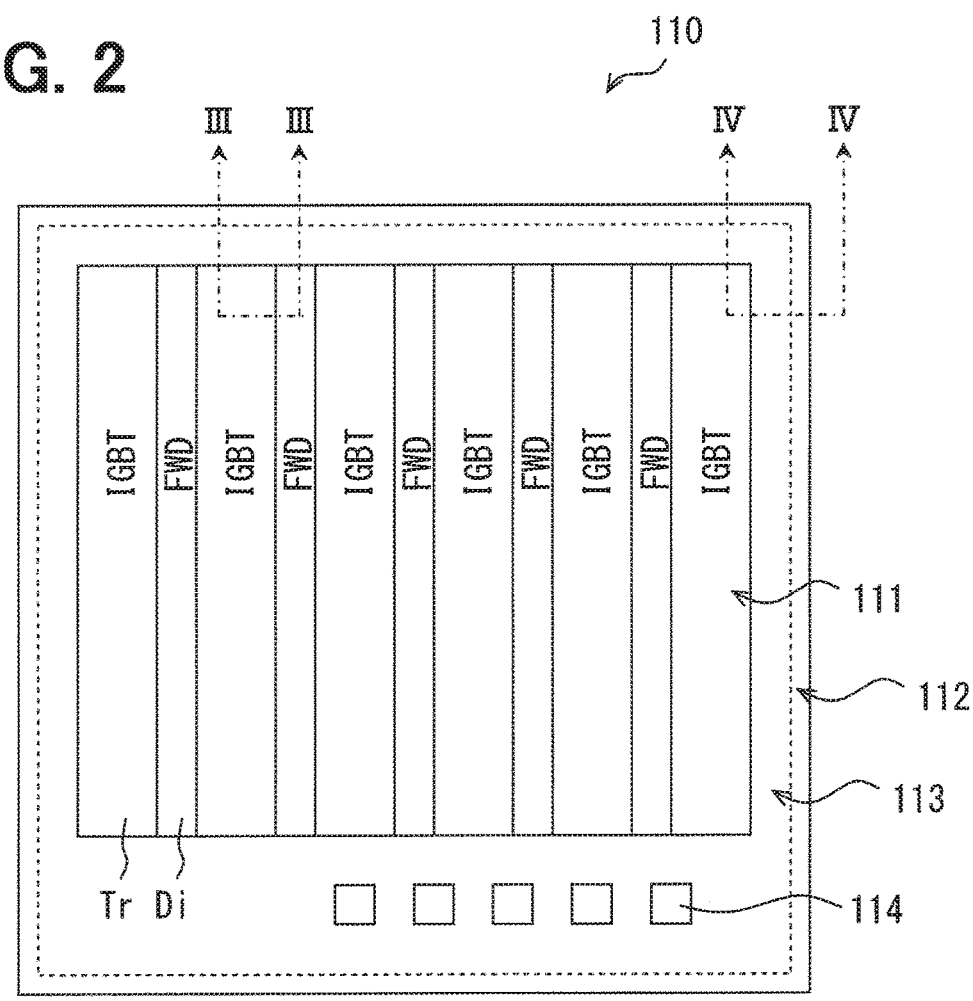
FIG. 2 is a top view showing the schematic configuration of a switching device.
Figure 3:
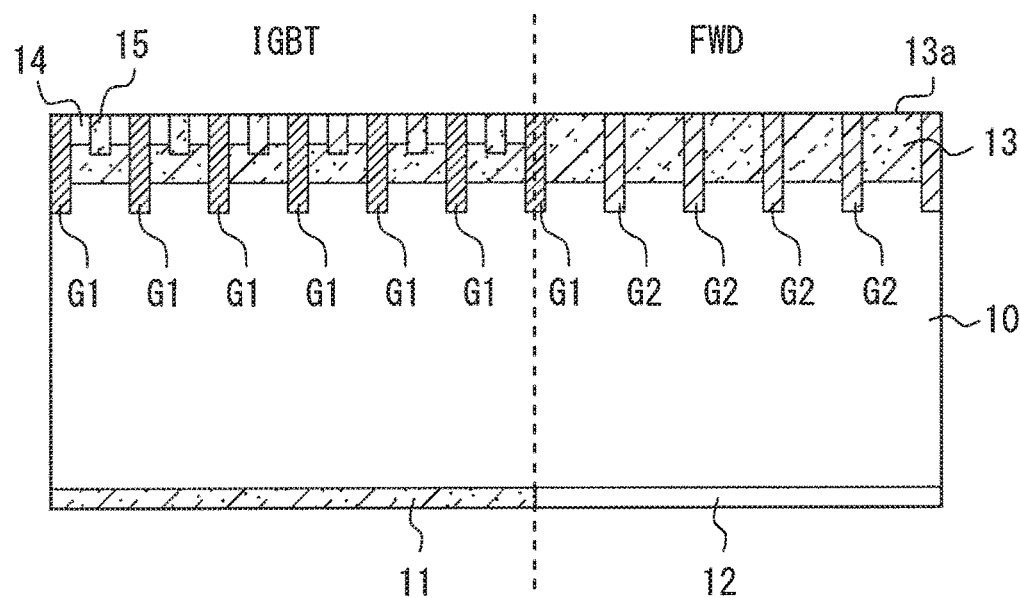
FIG. 3 is a cross-sectional view taken along the line III-III shown in FIG. 2.
Figure 4:
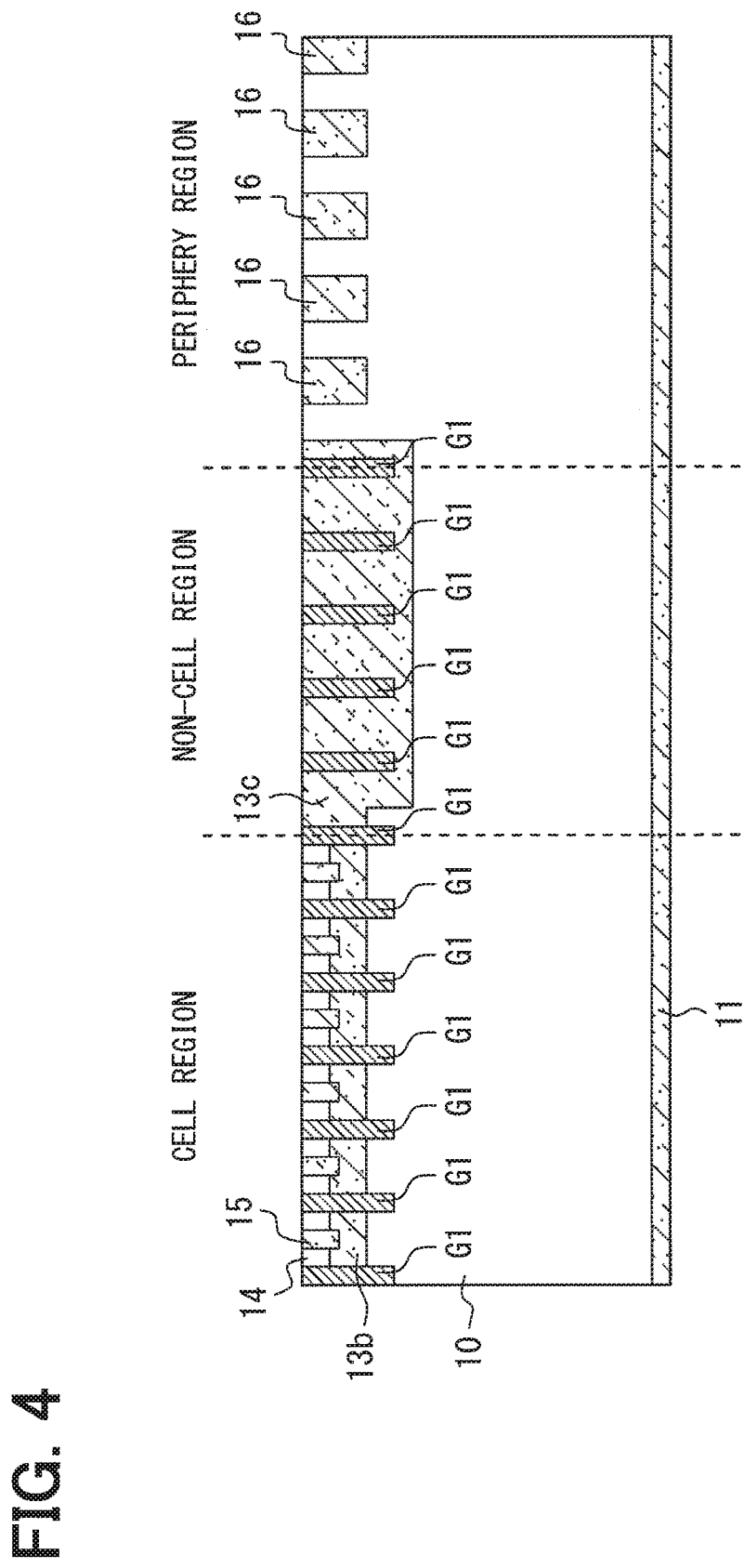
FIG. 4 is a cross-sectional view taken along a line IV-IV of FIG. 2.

FIG. 3 is a cross-sectional view taken along the line III-III illustrated in FIG. 2; FIG. 4 is a cross sectional view taken along a line IV-IV in FIG. 2; In FIGS. 3 and 4, hatched lines are illustrated at the trench gates G1, G2 and a semiconductor region having p-type conductivity. In contrast, hatched lines are not illustrated at a semiconductor region having n-type conductivity.

The switching device 110 is arranged at the semiconductor substrate. As shown in FIG. 2, the switching device 110 includes a cell region 111, a periphery region 112 and a non-cell region 113. In the cell region 111, the IGBT device Tr and the freewheeling diode Di are formed. The periphery region 112 is formed as a contour of the switching device 110 and is located at the periphery of the cell region 111. The non-cell region 113 as the periphery of the cell region 110 is configured to isolate the cell region 111 from the periphery region 112.

The cell region 111 includes the IGBT devices Tr and the freewheeling diodes Di. The IGBT device Tr and the freewheeling diode Di are alternately arranged and extended in the same direction. A strap-structure can be viewed in a direction perpendicular to the extending direction as the IGBT device Tr and the freewheeling diode Di are alternatively arranged. The IGBT device Tr corresponds to an IGBT region, and the freewheeling diode Di corresponds to an FWD region.

The configuration of the IGBT device Tr and the freewheeling diode Di is described with reference to FIG. 3 in detail. As shown in FIG. 3, as the broken line is regarded as the boundary, the left side of the drawing refers to the IGBT device Tr, and the right side of the drawing refers to the freewheeling diode Di.

The IGBT device Tr includes a drift region 10 having n-type conductivity, a collector region 11 having p-type conductivity, a base region 13 having p-type conductivity, and an emitter region 14 having n-type conductivity. The drift region 10, the collector region 11, the base region 13 and the emitter region 14 are regarded as the semiconductor regions. The IGBT device Tr includes a trench gate G1.

The drift region 10 is stacked on the collector region 11. The base region 13 is stacked on the drift region 10. The base region 13 is exposed to the surface 13a of the semiconductor substrate, and the emitter electrode (not shown) is connected to the base region 13. The trench gate G1 penetrates the base region 13 from the surface 13a and reaches the drift region 10. The trench gate G1 is in contact with the base region 13 and the drift region 10 through an insulation film (not shown). At the portion of the base region 13 exposed to the surface 13a and sandwiched between the emitter regions 14, the collector region 15 related to the junction between the base region 13 and the emitter electrode is formed.

Of the trench gates belonging to the IGBT device Tr, the trench gate G1 in contact with the emitter region 14 is an active trench gate configured to receive a gate voltage. In FIGS. 3 and 4, the active trench gate is denoted as the reference symbol G1, and the dummy trench gate is denoted as the reference symbol G2. The dummy trench gate does not receive a gate voltage. FIG. 3 illustrates that all of the trench gates belonging to the IGBT device Tr are active trench gates G1. However, the dummy trench gate G2 may be provided at a predetermined interval.

On the other hand, the freewheeling diode Di includes the drift region 10 shared with the IGBT device Tr, the base region 13 shared with the IGBT device Tr, and a cathode region 12 having n-type conductivity as the opposite side of the base region 13 with respect to the drift region 10. The drift region 10, the cathode region 12 and the base region 13 are semiconductor regions. The cathode region 12 is formed at the same plane level as the collector region 11, which is in the IGBT device Tr. The base region 13 in the freewheeling diode Tr has another name called as an anode region. All of the trench gates formed in the FWD device Di are dummy gates G2. The potential level of the dummy gate F2 is at a level same as the emitter's potential level (for example, a ground level: GND). The base region 13 of the freewheeling diode Di is at the emitter's potential level (GND).

The periphery region 112 is formed as the outer shape of a chip (or the contour of the switching device 110) as the outermost region of the switching device 110. As shown in FIG. 4, a guard ring 16 is arranged at the periphery region 112 to make the electric field uniformly in the drift region 10. The guard ring 16 is a semiconductor region having p-type conductivity formed at the surface layer of the surface 13a. The guard ring 16 is formed in a round shape to surround the non-cell region 113 and the cell region 111 when the semiconductor substrate is viewed in a plan view. The cell region 111 and the non-cell region 113 are surrounded by several guard rings 16. If the guard ring 16 and the base region 13 are formed in the same step, the number of manufacturing steps can be reduced, and it is not hindered to form the guard ring 16 at the concentration and depth, which are different from the base region 13.

As shown in FIG. 2, a pad 114 is formed at the non-cell region 113 for making an external electrical connection. A bonding wire (not shown) is connected to the pad 114. For example, the power supply VCC or the gate voltage is sent to the cell region 111 through the pad 114. The wiring such as the connection wiring between the power supply VCC and the switching device 110, the gate wiring, the emitter wiring of the IGBT device Tr and the Kelvin emitter wiring is extended from the pad 114 to the cell region 111. When the plurality of switching devices 110 to be connected in parallel are mounted so as to be closed to each other, the parasitic inductance L is generated between the wirings.

As shown in FIG. 4, the base region 13 and the active trench gate G1 are formed at the non-cell region 113 according to the present embodiment. In the present embodiment, the base region 13 includes a first base region 13b belonging to the cell region 111, and a second base region 13c belonging to the non-cell region 113. In the present embodiment, the step of forming the first base region 13b and the step of forming the second base region 13c are provided separately. In other words, the first base region 13b and the second base region 13c are formed as different diffusion layers.

On the other hand, the emitter region 14 and the contact region 15 are not formed. Accordingly, the non-cell region 13 is not positively expected to function as the IGBT device Tr or the freewheeling diode Di. However, the trench gates formed at the non-cell region 113 are the active trench gates G1 to which the gate voltage is applied, and form a capacitance between the gate and emitter. In other words, when it is compared with a situation where the active trench gates G1 are not formed at the non-cell region 113, the additional parasitic capacitance C can be formed as the capacitance between the gate and the emitter.

With regard to the present embodiment, in the non-cell region 113, the second base region 13c having p-type conductivity corresponding to the base region 13 is formed to be at a position deeper than the depth of the first base region 13a in the cell region 111, and covers the entire trench gates. The active trench gates G1 are formed in a stripe shape at the same interval and the same depth as the trench gate formed in the cell region 111.

Figure 5:
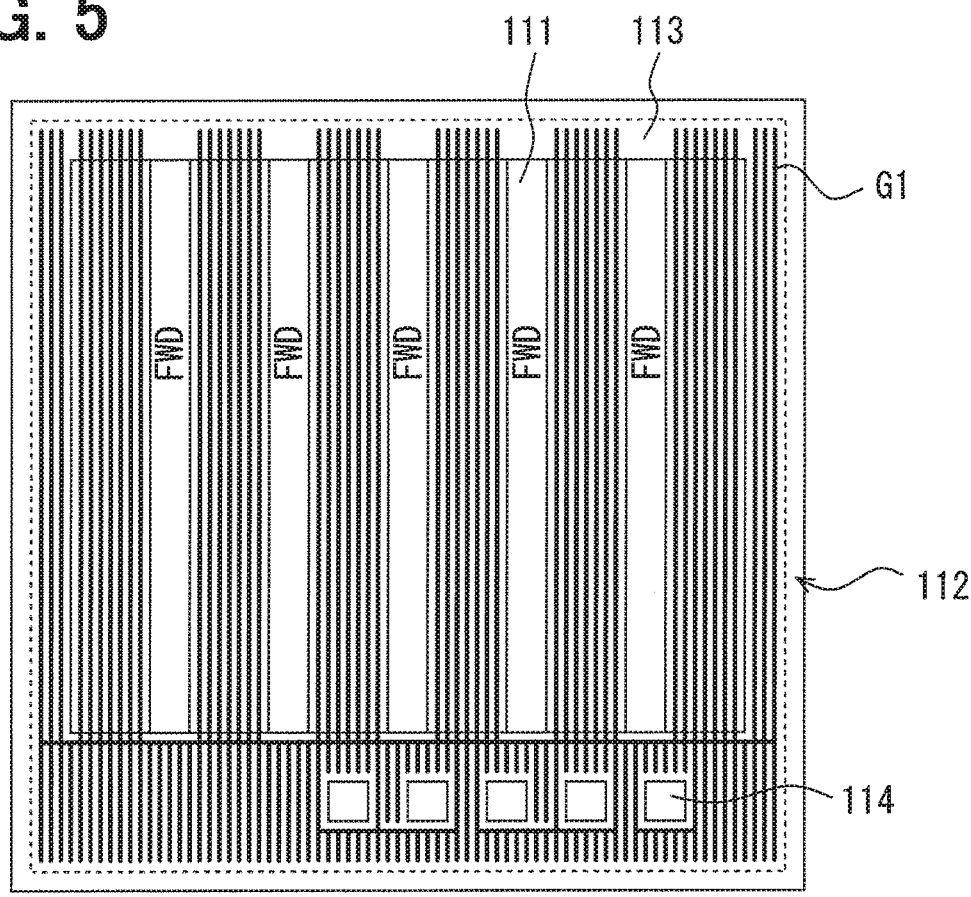
FIG. 5 is a top view that illustrates the routing of an active trench gate in a non-cell region.

In the non-cell region 113, the active trench gates G1, as shown in FIG. 5, are formed so not to overlap with the pads 114 when the semiconductor substrate is viewed from the front. With regard to the present embodiment, the active trench gates G1 formed at the cell region 111 are substantially extended to the non-cell region 113. The active trench gates G1 are routed so as to avoid the arrangement position of the pads 114.

The method of routing the active trench gates G1 is not limited to the particular example shown in FIG. 5. The method can be arbitrarily designed. It is noted that the dummy trench gates G2 are not illustrated in FIG. 5.

Figure 6:
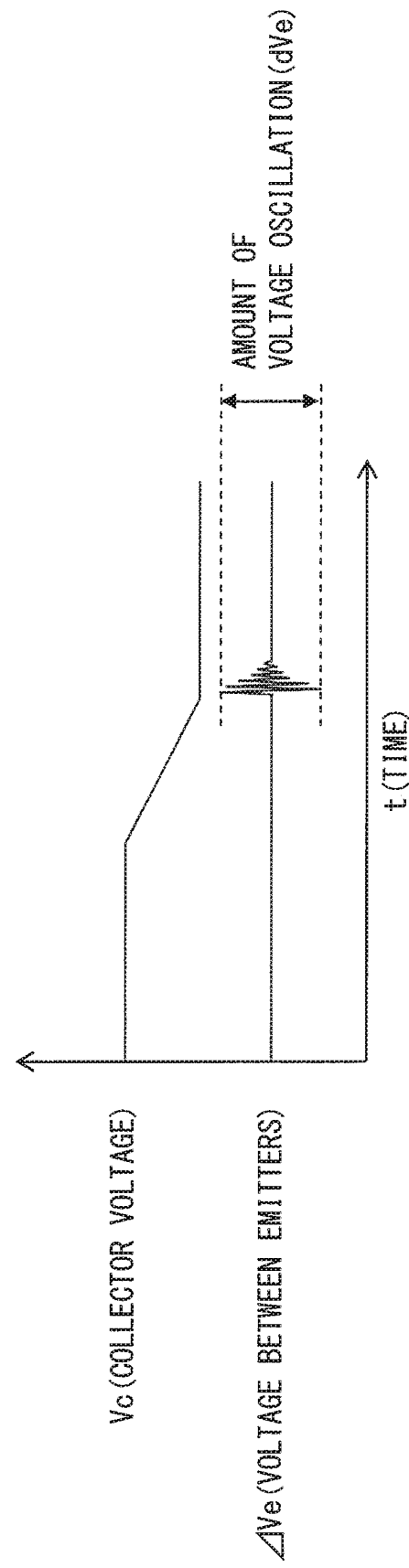
FIG. 6 illustrates a change in a collector voltage and an emitter voltage.

The following describes the behavior of the collector voltage Vc in the switching device 110 and the voltage ΔVe between the respective emitters of the two IGBT devices Tr connected in parallel with reference to FIG. 6.

As shown in FIG. 6, when the gate voltage is applied to the active trench gate G1, the IGBT device is turned on. The collector voltage is lowered because of the above-mentioned situation. Voltage oscillation occurs due to the parasitic inductance L when the collector voltage is lowered and reaches a substantially constant value to be converged. In particular, the voltage oscillation occurs caused by the parasitic inductance L at the emitter voltage Ve, and the voltage ΔVe between the respective emitters of the two IGBT devices Tr connected in parallel is in oscillation as a result. The maximum amplitude of the oscillation is defined as voltage oscillation dVe.

The voltage oscillation dVe caused by turning on the IGBT device Tr is illustrated in FIG. 6. However, it is also applied to the situation of turning off the IGBT device Tr.

Next, with reference to FIG. 7, the effects of utilizing the semiconductor device 100 in the present embodiment will be described.

The variation in voltage oscillation dVe with regard to the situation of adding capacitance to the original capacitance between the emitter and gate formed at the cell region 111 with either method is obtained through simulation. For example, a chip capacitor is added between the gate and emitter of the IGBT device Tr. Alternatively, the parasitic capacitance C is intentionally generated by forming the base region 13 and the active trench gate G1 at the non-cell region 113 such as the situation described in the present embodiment.

Figure 7:
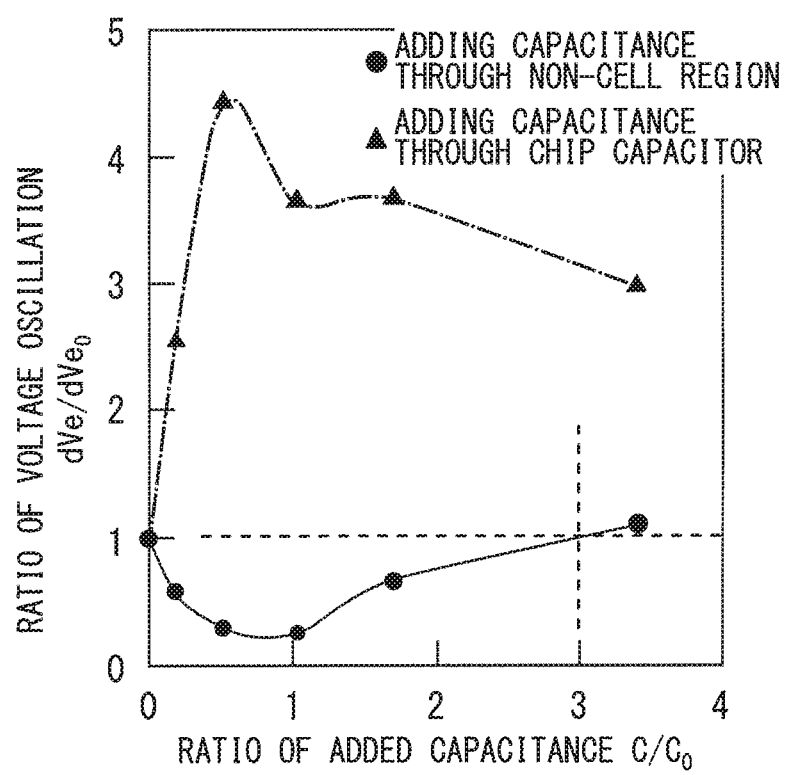
FIG. 7 illustrates a change of a ratio of voltage oscillation relative to a ratio of added capacitance to original capacitance.

FIG. 7 is a graph showing the results. The horizontal axis in FIG. 7 shows the ratio C/Co referring to the capacitance C to be added with respect to the original capacitance Co between the gate and the emitter in the cell region 111. The original capacitance Co refers to the capacitance before the addition of the capacitance. The vertical axis shows the ratio dVe/dVeo referring to the voltage oscillation dVe after the addition of the capacitance with respect to the voltage oscillation dVeo before the addition of capacitance.

According to FIG. 6, the addition of capacitance between the gate and the emitter through the implementation of a chip capacitor causes the voltage oscillation to increase. This is presumably due to the fact that the wiring causes the parasitic inductance when the wiring is used to connect the chip capacitor to the switching device 110. On the other hands, with regard to the situation where the parasitic capacitance C is generated by forming the base region 13 and the active trench gate G1 at the non-cell region 113 as described in the present embodiment, the voltage oscillation dye can be reduced over a range where the ratio C/Co is smaller than or equal to 3 as compared with the situation where the capacitance is not added.

Moreover, the active trench gate G1 at the non-cell region 113 is formed as to avoid the formation position of the pad 114; therefore, the strength of the pad 114 is not reduced.

The base region 13 at the non-cell region 113 is formed to a position deeper than the depth of the base region 13 of the cell region 111 so as to cover the all of the active trench gates G1; therefore, the parasitic capacitance C can be made larger.

As described above, the semiconductor device 100 according to the present embodiment is possible to increase the parasitic capacitance between the gate and the emitter to suppress the voltage oscillation dye without degrading the reliability of the pad 114.

Second Embodiment

Figure 8:
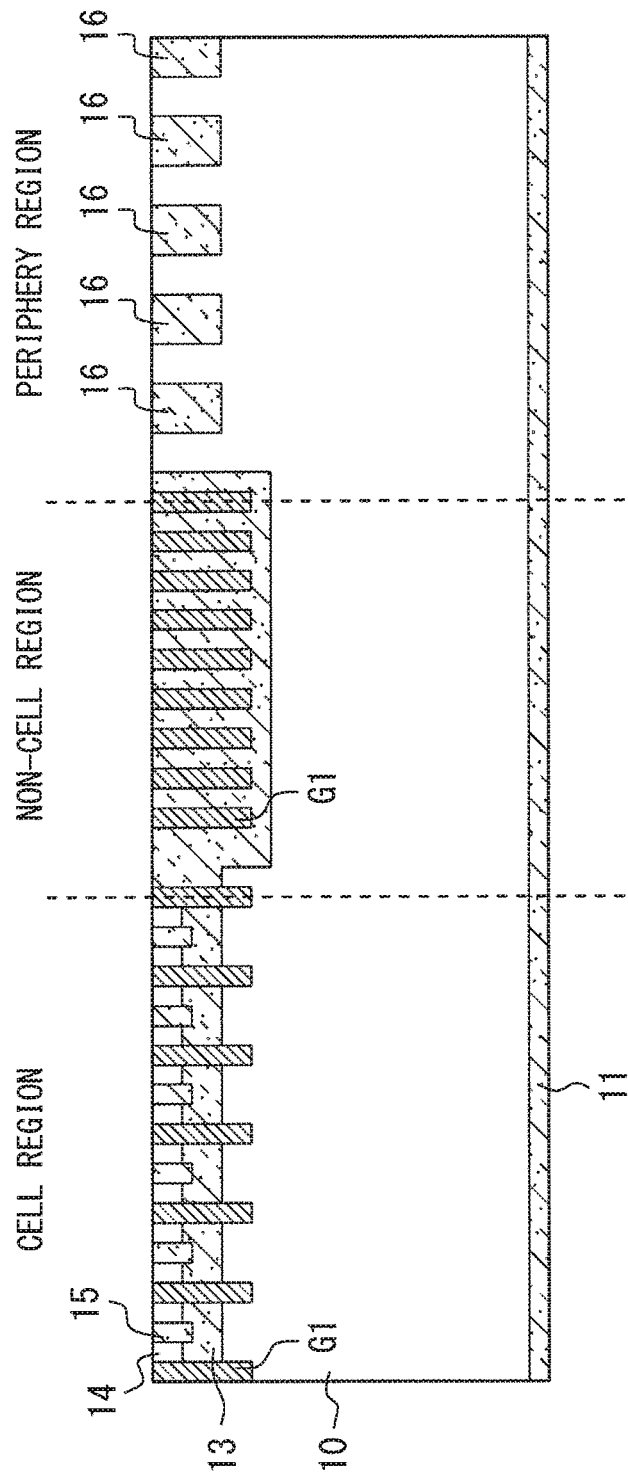
FIG. 8 is a cross-sectional view of a semiconductor device according to a second embodiment.

The first embodiment illustrates that the active trench gates G1 in the non-cell region 113 and the trench gates in the cell region 111 are formed at the same intervals with reference to FIG. 4. In contrast, with regard to the semiconductor device 100 according to the present embodiment as illustrated in FIG. 8, the formation interval of the active trench gate G1 in the non-cell region 113 is narrower than the formation interval of the trench gate in the cell region 111.

In other words, the non-cell region 113 has at least one region in which the active trench gates G1 are densely formed as compared with the formation density of the active trench gates G1 in the cell region 111.

Accordingly, the contact area between the active trench gate G1 and the base region 13 through an insulation film can be made larger; therefore, the parasitic capacitance C can also be made larger.

Third Embodiment

Figure 9:
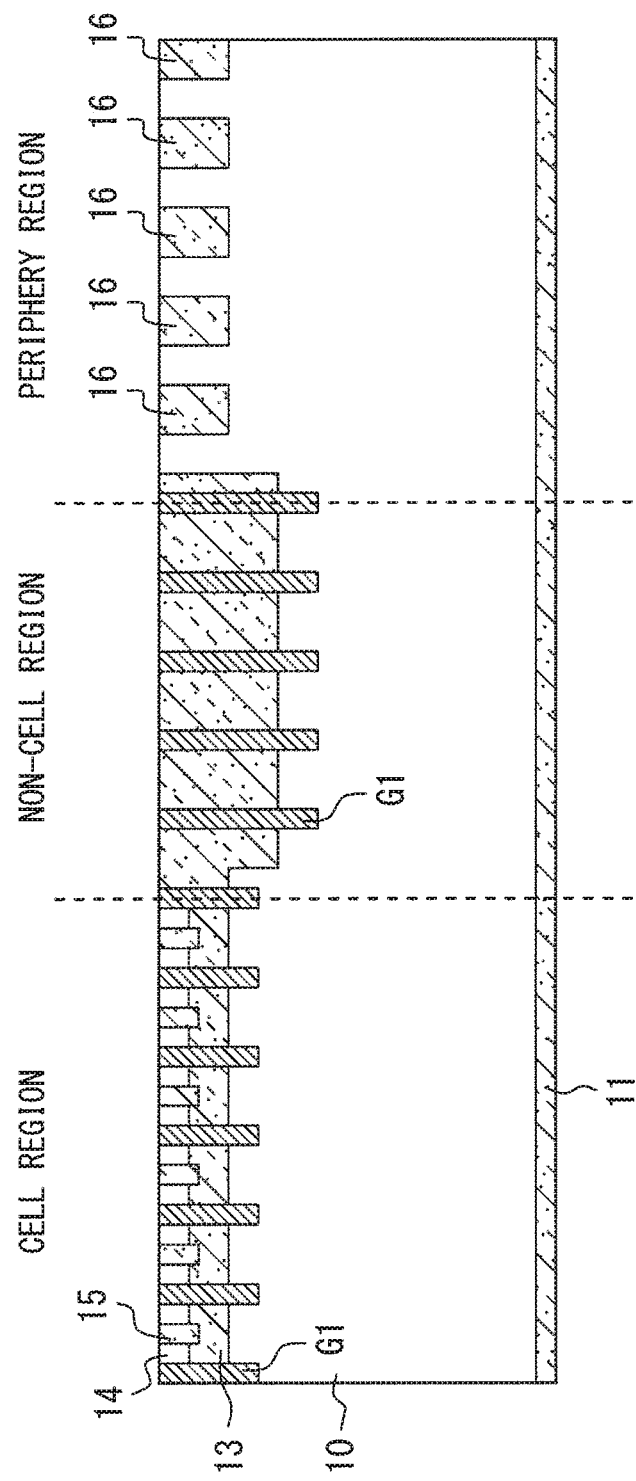
FIG. 9 is a cross-sectional view of a semiconductor device according to a third embodiment.

The first embodiment illustrates that the active trench gate G1 in the non-cell region 113 and the trench gates in the cell region 111 are formed at the same depth with reference to FIG. 4. In contrast, with regard to the semiconductor device 100 according to the present embodiment as illustrated in FIG. 9, the formation depth of the active trench gate G1 in the non-cell region 113 is made to be deeper than the formation depth of the trench gate in the cell region 111.

In other words, the non-cell region 113 has at least one portion where the active trench gates G1 are formed to reach a position deeper than the depth of the active trench gates G1 in the cell region 111.

Accordingly, the contact area between the active trench gate G1 and the base region 13 through an insulation film is made to be larger; therefore, the parasitic capacitance C can be made larger.

The parasitic capacitance C can be effectively made larger by increasing the formation density of the active trench gates G1 according to the second embodiment while increasing the formation depth of the active trench gates G1.

Fourth Embodiment

Figure 10:
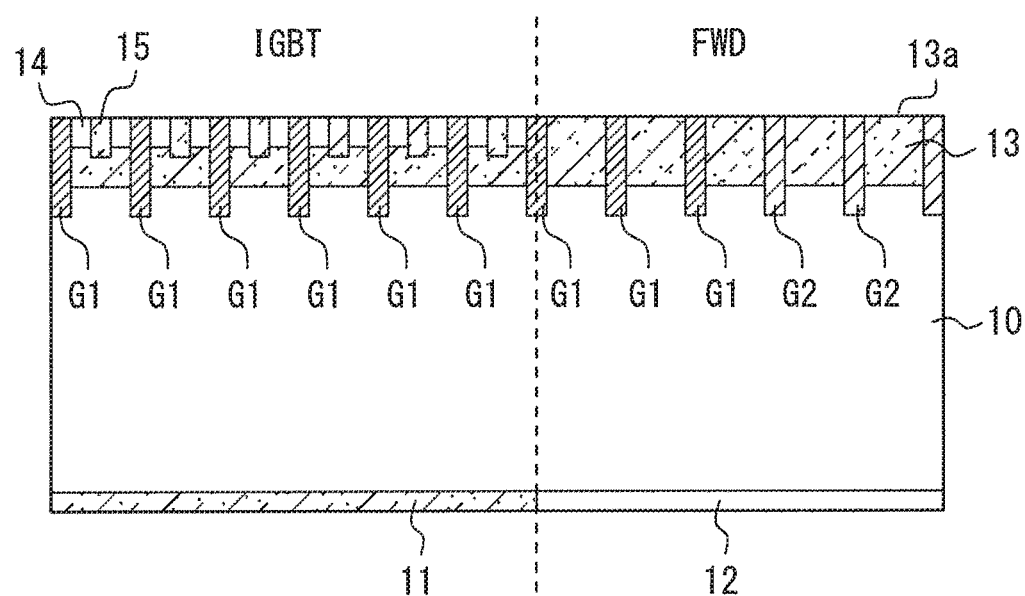
FIG. 10 is a cross-sectional view of a semiconductor device according to a fourth embodiment.

In addition to the above-mentioned embodiments, as illustrated in FIG. 10, at the boundary portion of the cell region 111 between the IGBT device Tr and the freewheeling diode Di, one part of the dummy trench gates G2 in the freewheeling diode are replaced by the active trench gates G1 to increase the capacitance between the gate and the emitter. The present embodiment illustrates that a portion of the freewheeling diode Di functions as the parasitic capacitance C. The parasitic capacitance C can be made larger by increasing the formation density of the active trench gates G1 within the freewheeling diode Di while increasing the formation depth of the active trench gates G1.

Other Embodiments

While embodiments of the present disclosure have been described above, the present disclosure is not limited in any way by the embodiments described above, and may be carried out with various modifications without departing from the scope of the gist of the present disclosure.

According to the above-mentioned embodiments, the routing of the active trench gates G1 at the non-cell region 113 is formed in a stripe form extended from the cell region as illustrated in, for example, FIG. 5. However, it is not limited to this case. The active trench gate G1 may be formed in an arbitrary shape in the non-cell region 113.

In the above-mentioned embodiments, the switching device 110 is an RC-IGBT. However, the IGBT may be formed without the formation of the freewheeling diode Di at the cell region 111. However, in a situation where the switching device 110 is merely an IGBT, the parasitic capacitance C cannot be formed at the freewheeling diode Di.

The present disclosure has been described with reference to the embodiments as described above, but the present disclosure should not be limited to these embodiments or the configurations. The present disclosure can include various modification examples as well as modifications made within equivalent ranges. Furthermore, various combinations and formations, and other combinations and formations including one or more than one or less than one element may be included in the scope and the spirit of the present disclosure.

The invention claimed is:

1. A semiconductor device comprising:
a plurality of switching devices; and
a semiconductor substrate, wherein:
the switching devices are connected in parallel to be driven;
the switching devices are at the semiconductor substrate;
each of the switching devices, in a plan view of the semiconductor substrate, includes:
a cell region as an insulated-gate bipolar transistor (IGBT) that is provided with an active trench gate, the active trench gate configured to be applied with a gate voltage;
a periphery region as a contour of the switching device; and
a non-cell region configured to isolate the cell region from the periphery region and to be arranged with a pad, the pad providing an electrical connection to the cell region; and
the non-cell region is also provided with an active trench gate that is at a position without overlapping the pad.

2. The semiconductor device according to claim 1, wherein
an arrangement of the active trench gate in at least one portion of the non-cell region is denser than an arrangement of the active trench gate in the cell region.

3. The semiconductor device according to claim 1, wherein
the active trench gate in at least one portion of the non-cell region reaches a position of the semiconductor substrate deeper than a depth of the active trench gate in the cell region.

4. The semiconductor device according to claim 1, wherein:
each of the switching devices further includes a base region at a surface layer of the semiconductor substrate provided with the active trench gate to generate a channel by applying the gate voltage to the active trench gate;
the base region includes:
a first base region belonging to the cell region, and
a second base region belonging to the non-cell region; and
at least one portion of the second base region is arranged to reach a position of the semiconductor substrate deeper than a depth of the first base region in a cross-sectional view of the semiconductor substrate.

5. The semiconductor device according to claim 1, wherein:
the cell region includes:
an IGBT region as the IGBT, and
a freewheeling diode (FWD) region as a freewheeling diode; and
the FWD region is also provided with an active trench gate at a portion adjacent to the IGBT region.

6. The semiconductor device according to claim 1, wherein
a ratio of parasitic capacitance between an emitter electrode and the active trench gate located in the non-cell region with respect to parasitic capacitance between an emitter and a base in the cell region is configured to be smaller than or equal to 3.

* * * * *